(12) United States Patent
Lee et al.

(10) Patent No.: US 10,483,247 B2
(45) Date of Patent: Nov. 19, 2019

(54) SEMICONDUCTOR DEVICE, DISPLAY PANEL, AND METHOD FOR MANUFACTURING DISPLAY PANEL

(71) Applicant: LG INNOTEK CO., LTD., Seoul (KR)

(72) Inventors: Sang Youl Lee, Seoul (KR); Chung Song Kim, Seoul (KR); Ji Hyung Moon, Seoul (KR); Sun Woo Park, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 16/083,134

(22) PCT Filed: Mar. 7, 2017

(86) PCT No.: PCT/KR2017/002460
§ 371 (c)(1),
(2) Date: Sep. 7, 2018

(87) PCT Pub. No.: WO2017/155284
PCT Pub. Date: Sep. 14, 2017

(65) Prior Publication Data
US 2019/0115328 A1    Apr. 18, 2019

(30) Foreign Application Priority Data
Mar. 8, 2016   (KR) ........................ 10-2016-0027729

(51) Int. Cl.
*H01L 25/13*       (2006.01)
*H01L 33/54*       (2010.01)
(Continued)

(52) U.S. Cl.
CPC .......... *H01L 25/13* (2013.01); *H01L 33/0079* (2013.01); *H01L 33/20* (2013.01);
(Continued)

(58) Field of Classification Search
CPC ......... H01L 25/13; H01L 33/54; H01L 33/20; H01L 33/0079; H01L 33/62;
(Continued)

(56) References Cited

U.S. PATENT DOCUMENTS

| 9,768,345 B2 * | 9/2017 | Hu .......................... H01L 33/06 |
| 2009/0039371 A1 | 2/2009 | Kim et al. |
| 2012/0025248 A1 | 2/2012 | Bae |

FOREIGN PATENT DOCUMENTS

| KR | 10-2006-0125079 A | 12/2006 |
| KR | 10-2009-0015514 A | 2/2009 |

(Continued)

OTHER PUBLICATIONS

International Search Report for PCT/KR2017/002460 (PCT/ISA/210) dated Jun. 30, 2017.

*Primary Examiner* — David Vu
(74) *Attorney, Agent, or Firm* — Birch, Stewart, Kolasch & Birch, LLP

(57) ABSTRACT

The semiconductor element according to an embodiment comprises: a light-emitting structure comprising a p-type semiconductor layer, an active layer disposed under the p-type semiconductor layer, and an n-type semiconductor layer disposed under the active layer; a protective layer disposed on the side surface and upper surface of the light-emitting structure; a p-type contact layer disposed over the p-type semiconductor layer; and an n-type contact layer disposed under the n-type semiconductor layer, wherein: the width of the lower surface of the n-type semiconductor layer is provided greater than that of the lower surface of the p-type semiconductor layer; the width of the upper surface of the n-type contact layer is provided greater than that of the upper surface of the n-type semiconductor layer; and the angle between the lower surface of the n-type semiconductor layer and the side surface of the light-emitting structure may be 30-80 degrees.

4 Claims, 10 Drawing Sheets

(51) Int. Cl.
*H01L 33/20* (2010.01)
*H01L 33/00* (2010.01)
*H01L 33/62* (2010.01)

(52) U.S. Cl.
CPC .............. *H01L 33/54* (2013.01); *H01L 33/62* (2013.01); *H01L 2933/005* (2013.01); *H01L 2933/0033* (2013.01)

(58) Field of Classification Search
CPC ....... H01L 2933/005; H01L 2933/0033; H01L 27/156; H01L 25/0753; H01L 33/58; H01L 33/00; H05B 33/14
See application file for complete search history.

(56) References Cited

FOREIGN PATENT DOCUMENTS

| | | | |
|---|---|---|---|
| KR | 10-2009-0118623 A | 11/2009 |
| KR | 10-1000311 B1 | 12/2010 |
| KR | 10-2012-0108411 A | 10/2012 |

\* cited by examiner

SEMICONDUCTOR DEVICE, DISPLAY PANEL, AND METHOD FOR MANUFACTURING DISPLAY PANEL

CROSS REFERENCE TO RELATED APPLICATIONS:

This application is the National Phase of PCT International Application No. PCT/KR2017/002460, filed on Mar. 7, 2017, which claims priority under 35 U.S.C. 119(a) to Patent Application No. 10-2016-0027729, filed in the Republic of Korea on Mar. 8, 2016, all of which are hereby expressly incorporated by reference into the present application.

TECHNICAL FIELD

Embodiments relate to a semiconductor device. Also, embodiments relate to a display panel including the semiconductor device and a display device. Also, embodiments relate to a method for manufacturing the display panel including the semiconductor device.

BACKGROUND ART

A light emitting diode (LED) is one of semiconductor devices that emit light when current is applied. The light emitting diode may emit light having high efficiency at a low voltage and thus has an excellent energy saving effect. As the luminance problem of the light emitting diode is improved, the light emitting diode has been variously applied to various devices such as a light source of a liquid crystal display device, an electric sign board, a display, a home appliance, and the like. Such a semiconductor device may include a light emitting diode, a laser diode, a quantum dot diode, and the like.

A technique related to a micro semiconductor display device in which each of semiconductor devices such as light emitting diodes is formed in a small size of several tens or several hundreds of micrometers, disposed as a pixel, and the semiconductor devices are arranged as pixels of a display device and driven to display an image is being studied. Such a micro semiconductor display device is advantageous in visibility and power consumption when compared to the conventional liquid crystal display device or organic light emitting display device. Studies on methods for realizing high resolution in a large display device, increasing manufacturing yield, and reducing manufacturing cost while improving the characteristics of the micro semiconductor display device are being carried out.

DISCLOSURE OF THE INVENTION

Technical Problem

Embodiments provide a semiconductor device, which is improved in light extraction efficiency, realizes high resolution, increases in manufacturing yield, and reduces in manufacturing cost, a display panel including the semiconductor device, and a display device.

Embodiments provide a method for manufacturing a display panel, which is improved in light extraction efficiency, realizes high resolution, increases in manufacturing yield, and reduces in manufacturing cost.

Technical Solution

A semiconductor device according to an embodiment may comprise: a light-emitting structure including a p-type semiconductor layer, an active layer disposed under the p-type semiconductor layer, and an n-type semiconductor layer disposed under the active layer; a protection layer disposed on a side surface and an upper surface of the light-emitting structure; a p-type contact layer disposed on the p-type semiconductor layer; an n-type contact layer disposed under the n-type semiconductor layer, wherein a lower surface of the n-type semiconductor layer has a width greater than that of a lower surface of the p-type semiconductor layer, wherein an upper surface of the n-type contact layer has a width greater than that of an upper surface of the n-type semiconductor layer, and wherein an angle between the lower surface of the n-type semiconductor layer and the side surface of the light-emitting structure is 30 degrees to 80 degrees.

A display panel according to an embodiment may comprise: a substrate; and a semiconductor device, wherein the semiconductor device includes: a light-emitting structure including a p-type semiconductor layer, an active layer disposed under the p-type semiconductor layer, and an n-type semiconductor layer disposed under the active layer; a protection layer disposed on a side surface and an upper surface of the light-emitting structure; a p-type contact layer disposed on the p-type semiconductor layer; an n-type contact layer disposed under the n-type semiconductor layer, wherein a lower surface of the n-type semiconductor layer has a width greater than that of a lower surface of the p-type semiconductor layer, wherein an upper surface of the n-type contact layer has a width greater than that of an upper surface of the n-type semiconductor layer, and wherein an angle between the lower surface of the n-type semiconductor layer and the side surface of the light-emitting structure is 30 degrees to 80 degrees.

A method for manufacturing a display panel according to an embodiment may comprise: forming a semiconductor layer on a growth substrate, the semiconductor layer comprising an n-type semiconductor layer, an active layer formed on the n-type semiconductor layer, and a p-type semiconductor layer formed on the active layer, on a growth substrate; performing an isolation process of isolating the semiconductor layer into a plurality of light-emitting structures to expose the n-type semiconductor layer between the plurality of light-emitting structures; forming a protection layer on side and upper surfaces of each of the plurality of light emitting structures; forming a p-type contact layer contacting the p-type semiconductor layer of each of the plurality of light-emitting structures; forming a sacrificial layer between the side surfaces of the plurality of light-emitting structures and on the p-type contact layer; attaching a first temporary substrate on the sacrificial layer by using an adhesion layer and separating the growth substrate; etching the n-type semiconductor layer provided between the plurality of light-emitting structures to expose the sacrificial layer disposed between the plurality of light-emitting structures; forming an n-type contact layer contacting an upper surface of the n-type semiconductor layer; removing the sacrificial layer disposed between the plurality of light-emitting structures to expose the adhesion layer; separating a portion of the plurality of light-emitting structures from the first temporary substrate so as to be arranged a predetermined interval on a second temporary substrate; and collectively attaching the light-emitting structures, which are arranged on the second temporary substrate, on a panel and removing the second temporary substrate.

Advantageous Effects

In the semiconductor device, the display panel including the semiconductor device, and the display device according to the embodiment, the light extraction efficiency can be improved, the high resolution can be realized, the manufacturing yield can be increased, and the manufacturing cost can be reduced.

In the method for manufacturing the display panel according to the embodiment, the light extraction efficiency can be improved, the high resolution can be realized, the manufacturing yield can be increased, and the manufacturing cost can be reduced.

In the method for manufacturing the display panel according to the embodiment, the semiconductor device may be manufactured in the form of the chip scale package. Thus, since the display panel is formed by performing the transfer process on the semiconductor device having the form of the chip scale package, the manufacturing yield can be increased, and the manufacturing cost can be reduced.

MODE FOR CARRYING OUT THE INVENTION

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on/over' and 'below/under' each layer will be made on the basis of drawings.

Hereinafter, a semiconductor device, a display panel, a display device, and a method of manufacturing the display panel according to embodiments will be described with reference to the accompanying drawings.

Figure 1:
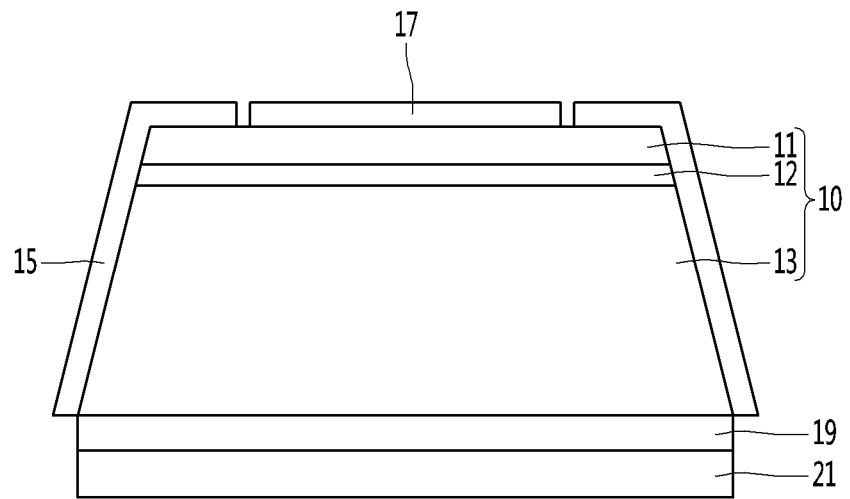
FIG. 1 is a view of a semiconductor device according to an embodiment.

FIG. 1 is a view of a semiconductor device according to an embodiment.

A semiconductor device according to an embodiment may include a light-emitting structure as illustrated in FIG. 1. The light-emitting structure 10 may include a p-type semiconductor layer 11, an active layer 12, and an n-type semiconductor layer 13. The active layer 12 may be disposed under the p-type semiconductor layer 11. The n-type semiconductor layer 13 may be disposed under the active layer 12.

In the light-emitting structure 10, a wavelength band of light generated according to a material forming the active layer 12 may vary. The selection of the material forming the p-type semiconductor layer 11 and the n-type semiconductor layer 13 may be changed depending on the material forming the active layer 12. The light-emitting structure 10 may be made of a compound semiconductor. The light-emitting structure 10 may be made of, for example, the groups II-VI or III-V compound semiconductors. For example, the light-emitting structure 10 may be made of at least two elements selected from aluminum (Al), gallium (Ga), indium (In), phosphorus (P), arsenic (As), and nitrogen (N).

The active layer 12 is a layer in which electrons injected through the n-type semiconductor layer 13 and holes injected through the p-type semiconductor layer 11 are meet each other to emit light by a band gap difference of an energy band depending on a formation material of the active layer 12. The active layer 12 may have one of a single well structure, a multi well structure, a quantum dot structure, and a quantum wire structure. The active layer 12 may be made of, for example, a compound semiconductor. The active layer 12 may be made of, for example, the groups II-V or III-V compound semiconductors.

When light having a blue wavelength band or green wavelength band is emitted from the active layer 12, the active layer 12 may be made of, for example, a semiconductor material having a compositional formula of $In_xAl_yGa_{1-x-y}N$ ($0 \le x \le 1$, $0 \le y \le 1$, $0 \le x+y \le 1$). When the active layer 12 has the multi well structure, a plurality of well layers and a plurality of barrier layers may be laminated with each other to form the active layer 12. When light having a red wavelength band is emitted from the active layer 12, the active layer 12 may be made of, for example, a semiconductor material having a compositional formula of $(Al_xGa_{1-x})_yIn_{1-y}P$ ($0 \le x \le 1$, $0 \le y \le 1$). The active layer 12 may be made of, for example, a material selected from AlGaInP, AlInP, GaP, GaInP, and the like. When the active layer 12 has the multi well structure, a plurality of well layers and a plurality of barrier layers may be laminated with each other to form the active layer 12. The active layer 12 may have a thickness of, for example, about 0.3 micrometers or less. For example, the active layer 12 may have a thickness of, more particularly, about 0.1 micrometers to about 0.3 micrometers.

The p-type semiconductor layer 11 may be made of a compound semiconductor. The p-type semiconductor layer 11 may be made of, for example, the groups II-VI or III-V compound semiconductors. For example, when light having the blue wavelength band or green wavelength band is emitted from the active layer 12, the p-type semiconductor layer 11 may be made of, for example, a semiconductor material having the compositional formula of $In_xAl_yGa_{1-x-y}N$ ($0 \le x \le 1$, $0 \le y \le 1$, $0 \le x+y \le 1$). Also, when light having the red wavelength band is emitted from the active layer 12, the p-type semiconductor layer 11 may be made of a semiconductor material having the compositional formula of $(Al_xGa_{1-x})_yIn_{1-y}P$ ($0 \le x \le 1$, $0 \le y \le 1$). The p-type semiconductor layer 11 may be formed of, for example, a material selected from GaN, AlN, AlGaN, InGaN, InN, InAlGaN, AlInN, AlGaAs, GaP, GaAs, GaAsP, AlGaInP, AlInP, GaInP, and the like and formed by doping a p-type dopant such as Mg, Zn, Ca, Sr, Br, or the like. The p-type semiconductor layer 11 may have a thickness of, for example, about 1 micrometer or less. For example, the p-type semiconductor layer 11 may have a thickness of, more particularly, about 0.1 micrometers to about 1 micrometer.

The n-type semiconductor layer 13 may be made of a compound semiconductor. The n-type semiconductor layer 13 may be made of, for example, the groups II-VI or III-V compound semiconductors. For example, when light having the blue wavelength band or green wavelength band is emitted from the active layer 12, the n-type semiconductor layer 13 may be made of a semiconductor material having the compositional formula of $In_xAl_yGa_{1-x-y}N$ ($0 \le x \le 1$, $0 \le y \le 1$, $0 \le x+y \le 1$). Also, when light having the red wavelength band is emitted from the active layer 12, the n-type semiconductor layer 13 may be made of a semiconductor material having the compositional formula of $(Al_xGa_{1-x})_yIn_{1-y}P$ ($0 \leq x \leq 1$, $0 \leq y \leq 1$). In the n-type semiconductor layer 13 expressed by the compositional formula, y may have a value of about 0.5, and x may have a value of about 0.5 to about 0.8. The n-type semiconductor layer 13 may be made of, for example, a material selected from GaN, AlN, AlGaN, InGaN, InN, InAlGaN, AlInN, AlGaAs, GaP, GaAs, GaAsP, AlGaInP, AlInP, GaInP, and the like and formed by doping an n-type dopant such as Si, Ge, Sn, Se, Te, or the like. The n-type semiconductor layer 13 may have a thickness of, for example, about 3 micrometers or less. For example, the n-type semiconductor layer 13 may have a thickness of, more particularly, about 0.1 micrometers to about 3 micrometers. The n-type semiconductor layer 13 may have a thickness greater than that of the p-type semiconductor layer 11.

The semiconductor device according to an embodiment may include a protection layer 15 as illustrated in FIG. 1. The protection layer 15 may be disposed on a side surface of the light-emitting structure 10. The protection layer 15 may be disposed on an upper surface of the light-emitting structure 10. A portion of the upper surface of the p-type semiconductor layer 11 may be exposed through the protection layer 15.

A semiconductor device according to an embodiment may include a p-type contact layer 17 as illustrated in FIG. 1. The p-type contact layer 17 may be disposed on the light-emitting structure 10. The p-type contact layer 17 may be disposed on the p-type semiconductor layer 11. The p-type contact layer 17 may be disposed to contact the upper surface of the p-type semiconductor layer 11 exposed through the protection layer 15.

The semiconductor device according to an embodiment may include an n-type contact layer 19 as illustrated in FIG. 1. The n-type contact layer 19 may be disposed under the light-emitting structure 10. The n-type contact layer 19 may be disposed under the n-type semiconductor layer 13. The n-type contact layer 19 may be disposed to contact a lower surface of the n-type semiconductor layer 13.

According to an embodiment, the lower surface of the n-type semiconductor layer 13 may have a width greater than that of the upper surface of the n-type semiconductor layer 13. According to an embodiment, the lower surface of the active layer 12 may have a width greater than that of the upper surface of the active layer 12. According to an embodiment, the lower surface of the p-type semiconductor layer 11 may have a width greater than that of the upper surface of the p-type semiconductor layer 11.

According to an embodiment, the lower surface of the n-type semiconductor layer 13 may have a width greater than that of the lower surface of the p-type semiconductor layer 11. According to an embodiment, the upper surface of the n-type semiconductor layer 13 may have a width greater than that of the lower surface of the p-type semiconductor layer 11.

As illustrated in FIG. 1, the light-emitting structure 10 according to an embodiment may have a structure that is inclined from a lower surface of the light-emitting structure to a direction of the upper surface of the light-emitting structure 10. For example, an angle a between the lower surface of the light-emitting structure 10 and the side surface of the light-emitting structure 10 may be about 30 degrees to about 80 degrees. The inclined angle between the lower surface of the light-emitting structure 10 and the side surface of the light-emitting structure 10 will be described in detail later while explaining a manufacturing process. In detail, the angle a between the lower surface of the light-emitting structure 10 and the side surface of the light-emitting structure 10 may be about 40 degrees to about 60 degrees.

The angle a between the lower surface of the n-type semiconductor layer 13 and the side surface of the light-emitting structure 10 may be about 30 degrees to about 80 degrees. In more detail, the angle a between the lower surface of the n-type semiconductor layer 13 and the side surface of the light-emitting structure 10 may be about 40 degrees to about 60 degrees. The angle a between the lower surface of the n-type semiconductor layer 13 and the side surface of the n-type semiconductor layer 13 may be about 30 degrees to about 80 degrees. In more detail, the angle a between the lower surface of the n-type semiconductor layer 13 and the side surface of the n-type semiconductor layer 13 may be about 40 degrees to about 60 degrees.

For example, the angle a between the lower surface of the n-type semiconductor layer 13 and the side surface of the protection layer 15 may be about 30 degrees to about 80 degrees. In more detail, the angle a between the lower surface of the n-type semiconductor layer 13 and the side surface of the protection layer 15 may be about 40 degrees to about 60 degrees.

The angle a between the lower surface of the p-type semiconductor layer 11 and the side surface of the protection layer 15 may be about 30 degrees to about 80 degrees. In more detail, the angle a between the lower surface of the p-type semiconductor layer 11 and the side surface of the protection layer 15 may be about 40 degrees to about 60 degrees. The angle a between the lower surface of the p-type semiconductor layer 11 and the side surface of the p-type semiconductor layer 11 may be about 30 degrees to about 80 degrees. In more detail, the angle a between the lower surface of the p-type semiconductor layer 11 and the side surface of the p-type semiconductor layer 11 may be about 40 degrees to about 60 degrees.

According to an embodiment, the upper surface of the n-type contact layer 19 may have a width equal to or greater than 70% of that of the lower surface of the n-type semiconductor layer 13. This is done for increasing in amount of light, which is emitted from the active layer 12 and reflected by the n-type contact layer 19 to proceed upward. For example, as illustrated in FIG. 1, the upper surface of the n-type contact layer 19 may have a width greater than that of the upper surface of the n-type semiconductor layer 13. Also, the upper surface of the n-type contact layer 19 may have the same width as that of the lower surface of the n-type semiconductor layer 13.

According to an embodiment, the n-type contact layer 19 may have a width greater than that of the p-type contact layer 17. The p-type contact layer 17 may have a width less than that of the upper surface of the p-type semiconductor layer 11. The p-type contact layer 17 may have a width less than that of the active layer 12. For example, according to an embodiment, the p-type contact layer 17 may have a surface area less than 70% of that of the active layer 12. In case of the general light emitting diode, the light emitting diode may be designed so that the p-type contact layer has a surface area equal to or greater than 80% of that of the active layer. However, in an embodiment, to increase in amount of light transmitted in a direction of the p-type contact layer 17, the p-type contact layer 17 may have a relatively small area. For example, the p-type contact layer 17 may have a surface area corresponding to 50% to 70% of that of the active layer 12. The p-type contact layer 17 may have a surface area equal to or greater than 50% of that of the active layer 12 so that power is stably applied to the p-type semiconductor layer 11 through the p-type contact layer 17. Also, the p-type contact layer 17 may have a surface area equal to or less than 70% of that of the active layer 12 to increase in amount of light transmitted in the direction of the p-type contact layer 17. Also, the p-type contact layer 17 may include a first area and a second area. The second are of the p-type contact layer 17 may extend from the first area, and the first area and the second area may have different widths, lengths, surface areas, or shapes.

Although the formation method and function of the protection layer 15 will be described in detail in the following manufacturing process, the protection layer 15 may be provided to prevent arching from occurring between the adjacent light-emitting structures. The protection layer 15 may include an insulation material. The protection layer 15 may include oxide, nitride, or organic material. The protection layer 15 may be made of, for example, at least one selected from materials such as $SiO_2$, $SiN_x$, $Al_2O_3$, and the like. For example, according to an embodiment, the protection layer 15 may have a thickness of about 1 micrometer or less. In more detail, the protection layer 15 may have a thickness of about 0.1 micrometers to about 1 micrometer.

According to an embodiment, the p-type contact layer 17 may be made of a material that ohmic-contacts the p-type semiconductor layer 11. For example, the p-type contact layer 17 may include transparent conductive oxide. For example, the p-type contact layer 17 may be made of at least one selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, $IrO_x$, $RuO_x$, NiO, Pt, Ag, and Ti. For example, the p-type semiconductor layer 17 may have a thickness of about 0.5 micrometers or less. For example, in more detail, the p-type semiconductor layer 17 may have a thickness of about 0.01 micrometers to about 0.5 micrometers.

According to an embodiment, the n-type contact layer 19 may be made of a material that ohmic-contacts the n-type semiconductor layer 13. Also, the n-type contact layer 19 may include a reflective material. For example, the n-type semiconductor layer 19 may have a thickness of about 2 micrometers or less. For example, in more detail, the n-type semiconductor layer 19 may have a thickness of about 0.1 micrometers to about 2 micrometers. The n-type contact layer 19 may include an ohmic contact layer contacting the n-type semiconductor layer and a reflective layer disposed under the ohmic contact layer. The n-type contact layer 19 may include an area that ohmic-contacts the n-type semiconductor layer 13. The n-type contact layer 19 may include a single layer or a multi-layer, which is made of at least one selected from Cr, Ni, Ti, Ge, Zn, Mg, Ca, Al, Ag, Rh, W, Pt, Au, AuGe, AuGe/Ni/Au, and the like.

The semiconductor device according to an embodiment may further include a bonding layer 21 disposed under the n-type contact layer 19. A conductive wire, a pad, or a conductive film, which applies power to the n-type contact layer 19 from the outside, may be connected to the bonding layer 21. For example, a lower surface of the bonding layer 21 may have the same width as that of the lower surface of the n-type contact layer 19. According to an embodiment, the bonding layer 21 may be omitted, and thus, the conductive wire, the pad, or the conductive film, which applies power from the outside, may be directly connected to the n-type contact layer 19. For example, the bonding layer 21 may include at least one selected from In, InAg, AuIn, and the like. The bonding layer 21 may have a thickness, for example, of about 1 micrometer to about 4 micrometers.

The semiconductor device according to an embodiment may have an inclined structure having a width that gradually decreases upward from a lower side of the light-emitting structure. Also, the n-type contact layer disposed under the light-emitting structure may have a large width or surface area to increase in reflectivity, and the p-type contact layer disposed on the light-emitting structure may have a small width or surface area to increase in transmittance. Therefore, light generated from the active layer may be effectively extracted toward the upper side of the light-emitting structure.

The above-described semiconductor device may be configured to emit light having various wavelength bands according to the selection of the active layer. For example, the semiconductor device may be realized as a micro semiconductor device having a width and length of about 200 micrometers or less. For example, the display panel or the display device constituting one color pixel may be realized by using the above-described blue, green, and red semiconductor devices, each of which has the micrometer size. The semiconductor device according to an embodiment may be applied to various fields that require a light source. The semiconductor device according to the embodiment may be applied as a light source that realizes high resolution by being applied to an electric signboard, a large display device, a signage, and the like.

Figure 2:
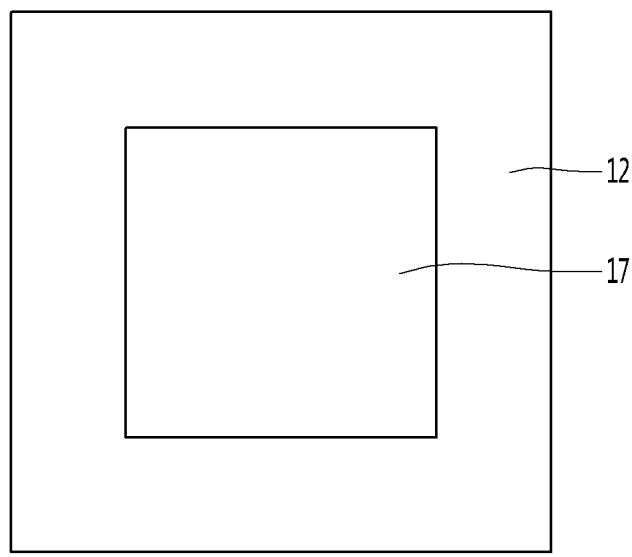
FIG. 2 is a view illustrating an arrangement relationship of an active layer and a p-type contact layer, which are applied to the semiconductor device according to an embodiment.
Figure 3:
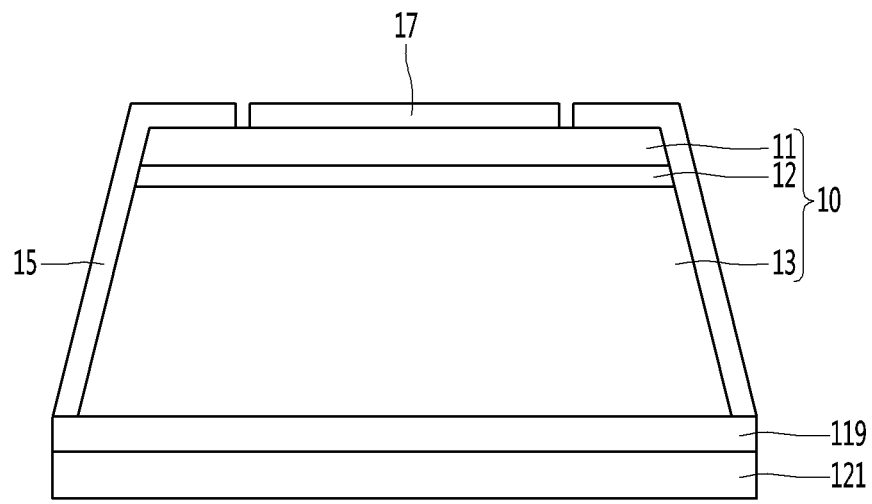
FIG. 3 is a view illustrating another example of the semiconductor device according to an embodiment.

FIG. 3 is a view illustrating another example of the semiconductor device according to an embodiment. In description of a semiconductor device according to an embodiment of FIG. 3, the description with respect to parts duplicated with those described with reference to FIGS. 1 and 2 may be omitted.

A semiconductor device according to an embodiment may include a light-emitting structure as illustrated in FIG. 3. The light-emitting structure 10 may include a p-type semiconductor layer 11, an active layer 12, and an n-type semiconductor layer 13. The active layer 12 may be disposed under the p-type semiconductor layer 11. The n-type semiconductor layer 13 may be disposed under the active layer 12.

The semiconductor device according to an embodiment may include a protection layer 15 as illustrated in FIG. 3. The protection layer 15 may be disposed on a side surface of the light-emitting structure 10. The protection layer 15 may be disposed on an upper surface of the light-emitting structure 10. A portion of the upper surface of the p-type semiconductor layer 11 may be exposed through the protection layer 15.

A semiconductor device according to an embodiment may include a p-type contact layer 17 as illustrated in FIG. 3. The p-type contact layer 17 may be disposed on the light-emitting structure 10. The p-type contact layer 17 may be disposed on the p-type semiconductor layer 11. The p-type contact layer 17 may be disposed to contact the upper surface of the p-type semiconductor layer 11 exposed through the protection layer 15.

The semiconductor device according to an embodiment may include an n-type contact layer 119 as illustrated in FIG. 3. The n-type contact layer 119 may be disposed under the light-emitting structure 10. The n-type contact layer 119 may be disposed under the n-type semiconductor layer 13. The n-type contact layer 119 may be disposed to contact a lower surface of the n-type semiconductor layer 13.

According to an embodiment, the lower surface of the n-type semiconductor layer 13 may have a width greater than that of the upper surface of the n-type semiconductor layer 13. According to an embodiment, the lower surface of the active layer 12 may have a width greater than that of the upper surface of the active layer 12. According to an embodiment, the lower surface of the p-type semiconductor layer 11 may have a width greater than that of the upper surface of the p-type semiconductor layer 11.

According to an embodiment, the lower surface of the n-type semiconductor layer 13 may have a width greater than that of the lower surface of the p-type semiconductor layer 11. According to an embodiment, the upper surface of the n-type semiconductor layer 13 may have a width greater than that of the lower surface of the p-type semiconductor layer 11.

As illustrated in FIG. 3, the light-emitting structure 10 according to an embodiment may have a structure that is inclined from a lower surface of the light-emitting structure to a direction of the upper surface of the light-emitting structure 10. For example, an angle a between the lower surface of the light-emitting structure 10 and the side surface of the light-emitting structure 10 may be about 30 degrees to about 80 degrees. The inclined angle between the lower surface of the light-emitting structure 10 and the side surface of the light-emitting structure 10 will be described in detail later while explaining a manufacturing process. In detail, the angle a between the lower surface of the light-emitting structure 10 and the side surface of the light-emitting structure 10 may be about 40 degrees to about 60 degrees.

The angle a between the lower surface of the n-type semiconductor layer 13 and the side surface of the light-emitting structure 10 may be about 30 degrees to about 80 degrees. In more detail, the angle a between the lower surface of the n-type semiconductor layer 13 and the side surface of the light-emitting structure 10 may be about 40 degrees to about 60 degrees. The angle a between the lower surface of the n-type semiconductor layer 13 and the side surface of the n-type semiconductor layer 13 may be about 30 degrees to about 80 degrees. In more detail, the angle a between the lower surface of the n-type semiconductor layer 13 and the side surface of the n-type semiconductor layer 13 may be about 40 degrees to about 60 degrees.

For example, the angle a between the lower surface of the n-type semiconductor layer 13 and the side surface of the protection layer 15 may be about 30 degrees to about 80 degrees. In more detail, the angle a between the lower surface of the n-type semiconductor layer 13 and the side surface of the protection layer 15 may be about 40 degrees to about 60 degrees.

The angle a between the lower surface of the p-type semiconductor layer 11 and the side surface of the protection layer 15 may be about 30 degrees to about 80 degrees. In more detail, the angle a between the lower surface of the p-type semiconductor layer 11 and the side surface of the protection layer 15 may be about 40 degrees to about 60 degrees. The angle a between the lower surface of the p-type semiconductor layer 11 and the side surface of the p-type semiconductor layer 11 may be about 30 degrees to about 80 degrees. In more detail, the angle a between the lower surface of the p-type semiconductor layer 11 and the side surface of the p-type semiconductor layer 11 may be about 40 degrees to about 60 degrees.

According to an embodiment, the upper surface of the n-type contact layer 119 may have a width equal to or greater than 70% of that of the lower surface of the n-type semiconductor layer 13. This is done for increasing in amount of light, which is emitted from the active layer 12 and reflected by the n-type contact layer 119 to proceed upward. For example, as illustrated in FIG. 3, the upper surface of the n-type contact layer 119 may have a width greater than that of the upper surface of the n-type semiconductor layer 13. Also, the upper surface of the n-type contact layer 119 may have a width greater than that of the lower surface of the n-type semiconductor layer 13. The upper surface of the n-type contact layer 119 may have the same width as the sum of the widths of the lower surface of the n-type semiconductor layer 13 and the lower surface of the protection layer 15. The lower surface of the protection layer 15 may be disposed on the upper surface of the n-type contact layer 119. The lower surface of the protection layer 15 may contact the upper surface of the n-type contact layer 119. As described above, since the n-type contact layer 119 has the large width or surface area, light generated from the active layer 12 may be effectively reflected to the upper side of the n-type contact layer 119.

According to an embodiment, the n-type contact layer 119 may have a width greater than that of the p-type contact layer 17. The p-type contact layer 17 may have a width less than that of the upper surface of the p-type semiconductor layer 11. The p-type contact layer 17 may have a width less than that of the active layer 12. For example, according to an embodiment, the p-type contact layer 17 may have a surface area less than 70% of that of the active layer 12. In case of the general light emitting diode, the light emitting diode may be designed so that the p-type contact layer has a surface area equal to or greater than 80% of that of the active layer. However, in an embodiment, to increase in amount of light transmitted in a direction of the p-type contact layer 17, the p-type contact layer 17 may have a relatively small area. For example, the p-type contact layer 17 may have a surface area corresponding to 50% to 70% of that of the active layer 12. The p-type contact layer 17 may have a surface area equal to or greater than 50% of that of the active layer 12 so that power is stably applied to the p-type semiconductor layer 11 through the p-type contact layer 17. Also, the p-type contact layer 17 may have a surface area equal to or less than 70% of that of the active layer 12 to increase in amount of light transmitted in the direction of the p-type contact layer 17. Also, the p-type contact layer 17 may include a first area and a second area. The second are of the p-type contact layer 17 may extend from the first area, and the first area and the second area may have different widths, lengths, surface areas, or shapes.

Although the formation method and function of the protection layer 15 will be described in detail in the following manufacturing process, the protection layer 15 may be provided to prevent arching from occurring between the adjacent light-emitting structures. The protection layer 15 may include an insulation material. The protection layer 15 may include oxide, nitride, or organic material. The protection layer 15 may be made of, for example, at least one selected from materials such as $SiO_2$, $SiN_x$, $Al_2O_3$, and the like.

According to an embodiment, the p-type contact layer 17 may be made of a material that ohmic-contacts the p-type semiconductor layer 11. For example, the p-type contact layer 17 may include transparent conductive oxide. For example, the p-type contact layer 17 may be made of at least one selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, $IrO_x$, $RuO_x$, NiO, Pt, Ag, and Ti.

According to an embodiment, the n-type contact layer 119 may be made of a material that ohmic-contacts the n-type semiconductor layer 13. Also, the n-type contact layer 119 may include a reflective material. The n-type contact layer 119 may include an ohmic contact layer contacting the n-type semiconductor layer and a reflective layer disposed under the ohmic contact layer. The n-type contact layer 119 may include an area that ohmic-contacts the n-type semiconductor layer 13. The n-type contact layer 119 may include a single layer or a multi-layer, which is made of at least one selected from Cr, Ni, Ti, Ge, Zn, Mg, Ca, Al, Ag, Rh, W, Pt, Au, AuGe, AuGe/Ni/Au, and the like.

The semiconductor device according to an embodiment may further include a bonding layer 121 disposed under the n-type contact layer 119. A conductive wire, a pad, or a conductive film, which applies power to the n-type contact layer 119 from the outside, may be connected to the bonding layer 121. For example, a lower surface of the bonding layer 121 may have the same width as that of the lower surface of the n-type contact layer 119. According to an embodiment, the bonding layer 121 may be omitted, and thus, the conductive wire, the pad, or the conductive film, which applies power from the outside, may be directly connected to the n-type contact layer 119. For example, the bonding layer 121 may include at least one selected from In, InAg, AuIn, and the like.

The semiconductor device according to an embodiment may have an inclined structure having a width that gradually decreases upward from a lower side of the light-emitting structure. Also, the n-type contact layer disposed under the light-emitting structure may have a large width or surface area to increase in reflectivity, and the p-type contact layer disposed on the light-emitting structure may have a small width or surface area to increase in transmittance. Therefore, light generated from the active layer may be effectively extracted toward the upper side of the light-emitting structure.

The above-described semiconductor device may be configured to emit light having various wavelength bands according to the selection of the active layer. For example, the semiconductor device may be realized as a micro semiconductor device having a width and length of about 200 micrometers or less. For example, the display panel or the display device constituting one color pixel may be realized by using the above-described blue, green, and red semiconductor devices, each of which has the micrometer size. The semiconductor device according to an embodiment may be applied to various fields that require a light source. The semiconductor device according to the embodiment may be applied as a light source that realizes high resolution by being applied to an electric signboard, a large display device, a signage, and the like.

Figure 4:
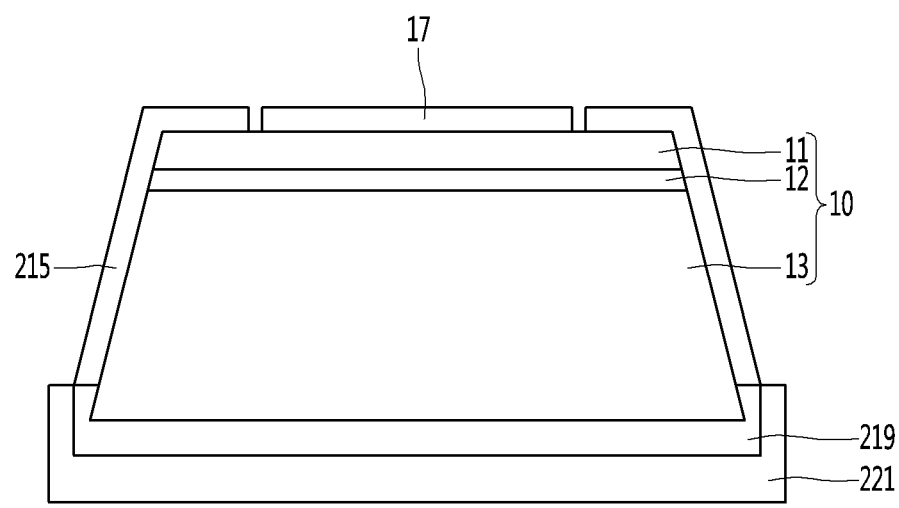
FIG. 4 is a view illustrating further another example of the semiconductor device according to an embodiment.

FIG. 4 is a view illustrating still another example of the semiconductor device according to an embodiment. In description of a semiconductor device according to an embodiment of FIG. 4, the description with respect to parts duplicated with those described with reference to FIGS. 1 to 3 may be omitted.

A semiconductor device according to an embodiment may include a light-emitting structure as illustrated in FIG. 4. The light-emitting structure 10 may include a p-type semiconductor layer 11, an active layer 12, and an n-type semiconductor layer 13. The active layer 12 may be disposed under the p-type semiconductor layer 11. The n-type semiconductor layer 13 may be disposed under the active layer 12.

The semiconductor device according to an embodiment may include a protection layer 215 as illustrated in FIG. 4. The protection layer 215 may be disposed on a side surface of the light-emitting structure 10. The protection layer 215 may be disposed on an upper surface of the light-emitting structure 10. A portion of the upper surface of the p-type semiconductor layer 11 may be exposed through the protection layer 215.

A semiconductor device according to an embodiment may include a p-type contact layer 17 as illustrated in FIG. 4. The p-type contact layer 17 may be disposed on the light-emitting structure 10. The p-type contact layer 17 may be disposed on the p-type semiconductor layer 11. The p-type contact layer 17 may be disposed to contact the upper surface of the p-type semiconductor layer 11 exposed through the protection layer 215.

The semiconductor device according to an embodiment may include an n-type contact layer 219 as illustrated in FIG. 4. The n-type contact layer 219 may be disposed under the light-emitting structure 10. The n-type contact layer 219 may be disposed under the n-type semiconductor layer 13. The n-type contact layer 219 may be disposed to contact a lower surface of the n-type semiconductor layer 13. The n-type contact layer 219 may be disposed on the side surface of the n-type semiconductor layer 13. For example, the first region of the n-type contact layer 219 may contact the lower surface of the n-type semiconductor layer 13, and the second area of the n-type contact layer 219 may contact the side surface of the n-type semiconductor layer 13.

According to an embodiment, the lower surface of the n-type semiconductor layer 13 may have a width greater than that of the upper surface of the n-type semiconductor layer 13. According to an embodiment, the lower surface of the active layer 12 may have a width greater than that of the upper surface of the active layer 12. According to an embodiment, the lower surface of the p-type semiconductor layer 11 may have a width greater than that of the upper surface of the p-type semiconductor layer 11.

According to an embodiment, the lower surface of the n-type semiconductor layer 13 may have a width greater than that of the lower surface of the p-type semiconductor layer 11. According to an embodiment, the upper surface of the n-type semiconductor layer 13 may have a width greater than that of the lower surface of the p-type semiconductor layer 11.

As illustrated in FIG. 4, the light-emitting structure 10 according to an embodiment may have a structure that is inclined from a lower surface of the light-emitting structure to a direction of the upper surface of the light-emitting structure 10. For example, an angle a between the lower surface of the light-emitting structure 10 and the side surface of the light-emitting structure 10 may be about 30 degrees to about 80 degrees. The inclined angle between the lower surface of the light-emitting structure 10 and the side surface of the light-emitting structure 10 will be described in detail later while explaining a manufacturing process. In detail, the angle a between the lower surface of the light-emitting structure 10 and the side surface of the light-emitting structure 10 may be about 40 degrees to about 60 degrees.

The angle a between the lower surface of the n-type semiconductor layer 13 and the side surface of the light-emitting structure 10 may be about 30 degrees to about 80 degrees. In more detail, the angle a between the lower surface of the n-type semiconductor layer 13 and the side surface of the light-emitting structure 10 may be about 40 degrees to about 60 degrees. The angle a between the lower surface of the n-type semiconductor layer 13 and the side surface of the n-type semiconductor layer 13 may be about 30 degrees to about 80 degrees. In more detail, the angle a between the lower surface of the n-type semiconductor layer 13 and the side surface of the n-type semiconductor layer 13 may be about 40 degrees to about 60 degrees.

For example, the angle a between the lower surface of the n-type semiconductor layer 13 and the side surface of the protection layer 215 may be about 30 degrees to about 80 degrees. In more detail, the angle a between the lower surface of the n-type semiconductor layer 13 and the side surface of the protection layer 215 may be about 40 degrees to about 60 degrees.

The angle a between the lower surface of the p-type semiconductor layer 11 and the side surface of the protection layer 215 may be about 30 degrees to about 80 degrees. In more detail, the angle a between the lower surface of the p-type semiconductor layer 11 and the side surface of the protection layer 215 may be about 40 degrees to about 60 degrees. The angle a between the lower surface of the p-type semiconductor layer 11 and the side surface of the p-type semiconductor layer 11 may be about 30 degrees to about 80 degrees. In more detail, the angle a between the lower surface of the p-type semiconductor layer 11 and the side surface of the p-type semiconductor layer 11 may be about 40 degrees to about 60 degrees.

According to an embodiment, the upper surface of the n-type contact layer 219 may have a width equal to or greater than 70% of that of the lower surface of the n-type semiconductor layer 13. This is done for increasing in amount of light, which is emitted from the active layer 12 and reflected by the n-type contact layer 219 to proceed upward. For example, as illustrated in FIG. 4, the upper surface of the n-type contact layer 219 may have a width greater than that of the upper surface of the n-type semiconductor layer 13. Also, the upper surface of the n-type contact layer 219 may have a width greater than that of the lower surface of the n-type semiconductor layer 13. The upper surface of the n-type contact layer 119 may have the same width as the sum of the widths of the lower surface of the n-type semiconductor layer 13 and the lower surface of the protection layer 215. The lower surface of the protection layer 215 may be disposed on the upper surface of the n-type contact layer 219. The lower surface of the protection layer 215 may contact the upper surface of the n-type contact layer 219. As described above, since the n-type contact layer 219 has the large width or surface area, light generated from the active layer 12 may be effectively reflected to the upper side of the n-type contact layer 219.

According to an embodiment, the n-type contact layer 219 may have a width greater than that of the p-type contact layer 17. The p-type contact layer 17 may have a width less than that of the upper surface of the p-type semiconductor layer 11. The p-type contact layer 17 may have a width less than that of the active layer 12. For example, according to an embodiment, the p-type contact layer 17 may have a surface area less than 70% of that of the active layer 12. In case of the general light emitting diode, the light emitting diode may be designed so that the p-type contact layer has a surface area equal to or greater than 80% of that of the active layer. However, in an embodiment, to increase in amount of light transmitted in a direction of the p-type contact layer 17, the p-type contact layer 17 may have a relatively small area. For example, the p-type contact layer 17 may have a surface area corresponding to 50% to 70% of that of the active layer 12. The p-type contact layer 17 may have a surface area equal to or greater than 50% of that of the active layer 12 so that power is stably applied to the p-type semiconductor layer 11 through the p-type contact layer 17. Also, the p-type contact layer 17 may have a surface area equal to or less than 70% of that of the active layer 12 to increase in amount of light transmitted in the direction of the p-type contact layer 17. Also, the p-type contact layer 17 may include a first area and a second area. The second are of the p-type contact layer 17 may extend from the first area, and the first area and the second area may have different widths, lengths, surface areas, or shapes.

Although the formation method and function of the protection layer 215 will be described in detail in the following manufacturing process, the protection layer 215 may be provided to prevent arching from occurring between the adjacent light-emitting structures. The protection layer 215 may include an insulation material. The protection layer 215 may include oxide, nitride, or organic material. The protection layer 215 may be made of, for example, at least one selected from materials such as $SiO_2$, $SiN_x$, $Al_2O_3$, and the like.

According to an embodiment, the p-type contact layer 17 may be made of a material that ohmic-contacts the p-type semiconductor layer 11. For example, the p-type contact layer 17 may include transparent conductive oxide. For example, the p-type contact layer 17 may be made of at least one selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, $IrO_x$, $RuO_x$, NiO, Pt, Ag, and Ti.

According to an embodiment, the n-type contact layer 219 may be made of a material that ohmic-contacts the n-type semiconductor layer 13. Also, the n-type contact layer 219 may include a reflective material. The n-type contact layer 219 may include an ohmic contact layer contacting the n-type semiconductor layer and a reflective layer disposed under the ohmic contact layer. The n-type contact layer 219 may include an area that ohmic-contacts the n-type semiconductor layer 13. The n-type contact layer 219 may include a single layer or a multi-layer, which is made of at least one selected from Cr, Ni, Ti, Ge, Zn, Mg, Ca, Al, Ag, Rh, W, Pt, Au, AuGe, AuGe/Ni/Au, and the like.

The semiconductor device according to an embodiment may further include a bonding layer 221 disposed under the n-type contact layer 219. A conductive wire, a pad, or a conductive film, which applies power to the n-type contact layer 219 from the outside, may be connected to the bonding layer 221. For example, a lower surface of the bonding layer 221 may have a width greater than that of the lower surface of the n-type contact layer 219. The first area of the bonding layer 221 may contact the lower surface of the n-type contact layer 219, and the second area of the bonding layer 221 may contact the side surface of the n-type contact layer 219. For example, the upper surface of the second area of the bonding layer 221 may be disposed higher than the lower surface of the n-type semiconductor layer 13. According to an embodiment, the bonding layer 221 may be omitted, and thus, the conductive wire, the pad, or the conductive film, which applies power from the outside, may be directly connected to the n-type contact layer 219. For example, the bonding layer 221 may include at least one selected from In, InAg, AuIn, and the like.

The semiconductor device according to an embodiment may have an inclined structure having a width that gradually decreases upward from a lower side of the light-emitting structure. Also, the n-type contact layer disposed under the light-emitting structure may have a large width or surface area to increase in reflectivity, and the p-type contact layer disposed on the light-emitting structure may have a small width or surface area to increase in transmittance. Therefore, light generated from the active layer may be effectively extracted toward the upper side of the light-emitting structure.

The above-described semiconductor device may be configured to emit light having various wavelength bands according to the selection of the active layer. For example, the semiconductor device may be realized as a micro semiconductor device having a width and length of about 200 micrometers or less. For example, the display panel or the display device constituting one color pixel may be realized by using the above-described blue, green, and red semiconductor devices, each of which has the micrometer size. The semiconductor device according to an embodiment may be applied to various fields that require a light source. The semiconductor device according to the embodiment may be applied as a light source that realizes high resolution by being applied to an electric signboard, a large display device, a signage, and the like.

Hereinafter, a method of manufacturing the display panel to which the semiconductor device according to an embodiment will be described with reference to FIGS. 5 to 17. FIGS. 5 to 17 are views illustrating a method for manufacturing a display panel according to an embodiment.

Figure 5:
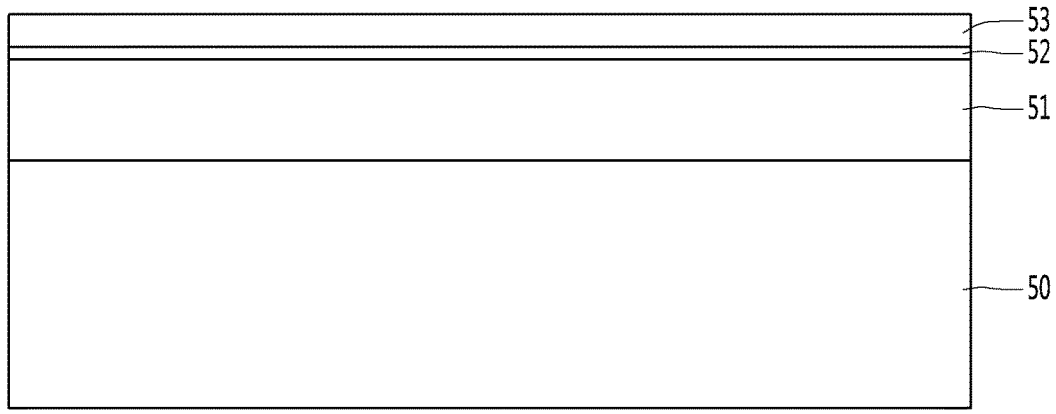
FIGS. 5 to 17 are views illustrating a method for manufacturing a display panel according to an embodiment.

According to a method for manufacturing the display panel according to an embodiment, as illustrated in FIG. 5, a semiconductor layer including an n-type semiconductor layer 51, an active layer 52, and a p-type semiconductor layer 53 may be formed on a growth substrate 50.

For example, the n-type semiconductor layer 51 may be grown on the growth substrate 50. According to an embodiment, a buffer layer may be formed on the growth substrate 50, and the n-type semiconductor layer 51 may be grown on the buffer layer. Then, the active layer 52 may be grown on the n-type semiconductor layer 51, and the p-type semiconductor layer 53 may be grown on the active layer 52. The semiconductor layer may be a plurality of light-emitting structures, which are isolated through an isolation process. The semiconductor layer may be made of a compound semiconductor. The semiconductor layer 12 may be made of, for example, the groups II-V or III-V compound semiconductors. For example, the semiconductor layer may be made of at least two elements selected from aluminum (Al), gallium (Ga), indium (In), phosphorus (P), arsenic (As), and nitrogen (N).

The growth substrate 50 may be made of, for example, at least one of sapphire ($Al_2O_3$), SiC, GaAs, GaN, ZnO, Si, GaP, InP, and Ge.

In the light-emitting structure, a wavelength band of light generated according to a material forming the active layer 52 may vary. The selection of the material forming the p-type semiconductor layer 53 and the n-type semiconductor layer 51 may be changed depending on the material forming the active layer 52.

The active layer 52 may be made of a compound semiconductor. The active layer 52 may be made of, for example, the groups II-VI or III-V compound semiconductors. When light having a blue wavelength band or green wavelength band is emitted from the active layer 52, the active layer 52 may be made of, for example, a semiconductor material having a compositional formula of $In_xAl_yGa_{1-x-y}N$ ($0 \le x \le 1$, $0 \le y \le 1$, $0 \le x+y \le 1$). When the active layer 52 has the multi well structure, a plurality of well layers and a plurality of barrier layers may be laminated with each other to form the active layer 52. When light having a red wavelength band is emitted from the active layer 52, the active layer 52 may be made of, for example, a semiconductor material having a compositional formula of $(Al_xGa_{1-x})_yIn_{1-y}P$ ($0 \le x \le 1$, $0 \le y \le 1$). The active layer 52 may be made of, for example, a material selected from AlGaInP, AlInP, GaP, GaInP, and the like. When the active layer 52 has the multi well structure, a plurality of well layers and a plurality of barrier layers may be laminated with each other to form the active layer 52. The active layer 52 may have a thickness of, for example, about 0.3 micrometers or less. For example, the active layer 52 may have a thickness of, more particularly, about 0.1 micrometers to about 0.3 micrometers.

The p-type semiconductor layer 53 may be made of a compound semiconductor. The p-type semiconductor layer 53 may be made of, for example, the groups II-VI or III-V compound semiconductors. For example, when light having the blue wavelength band or green wavelength band is emitted from the active layer 52, the p-type semiconductor layer 53 may be made of, for example, a semiconductor material having the compositional formula of $In_xAl_yGa_{1-x-y}N$ ($0 \le x \le 1$, $0 \le y \le 1$, $0 \le x+y \le 1$). Also, when light having the red wavelength band is emitted from the active layer 52, the p-type semiconductor layer 53 may be made of a semiconductor material having the compositional formula of $(Al_xGa_{1-x})_yIn_{1-y}P$ ($0 \le x \le 1$, $0 \le y \le 1$). The p-type semiconductor layer 53 may be formed of, for example, a material selected from GaN, AlN, AlGaN, InGaN, InN, InAlGaN, AlInN, AlGaAs, GaP, GaAs, GaAsP, AlGaInP, AlInP, GaInP, and the like and formed by doping a p-type dopant such as Mg, Zn, Ca, Sr, Br, or the like. The p-type semiconductor layer 53 may have a thickness of, for example, about 1 micrometer or less. For example, the p-type semiconductor layer 53 may have a thickness of, more particularly, about 0.1 micrometers to about 1 micrometer.

The n-type semiconductor layer 51 may be made of a compound semiconductor. The n-type semiconductor layer 51 may be made of, for example, the groups II-VI or III-V compound semiconductors. For example, when light having the blue wavelength band or green wavelength band is emitted from the active layer 52, the n-type semiconductor layer 51 may be made of a semiconductor material having the compositional formula of $In_xAl_yGa_{1-x-y}N$ ($0 \le x \le 1$, $0 \le y \le 1$, $0 \le x+y \le 1$). Also, when light having the red wavelength band is emitted from the active layer 52, the n-type semiconductor layer 51 may be made of a semiconductor material having the compositional formula of $(Al_xGa_{1-x})_yIn_{1-y}P$ ($0 \le x \le 1$, $0 \le y \le 1$). In the n-type semiconductor layer 51 expressed by the compositional formula, y may have a value of about 0.5, and x may have a value of about 0.5 to about 0.8. The n-type semiconductor layer 51 may be made of, for example, a material selected from GaN, AlN, AlGaN, InGaN, InN, InAlGaN, AlInN, AlGaAs, GaP, GaAs, GaAsP, AlGaInP, AlInP, GaInP, and the like and formed by doping an n-type dopant such as Si, Ge, Sn, Se, Te, or the like. The n-type semiconductor layer 51 may have a thickness of, for example, about 3 micrometers or less. For example, the n-type semiconductor layer 51 may have a thickness of, more particularly, about 0.1 micrometers to about 3 micrometers. The n-type semiconductor layer 51 may have a thickness greater than that of the p-type semiconductor layer 53.

Figure 6:
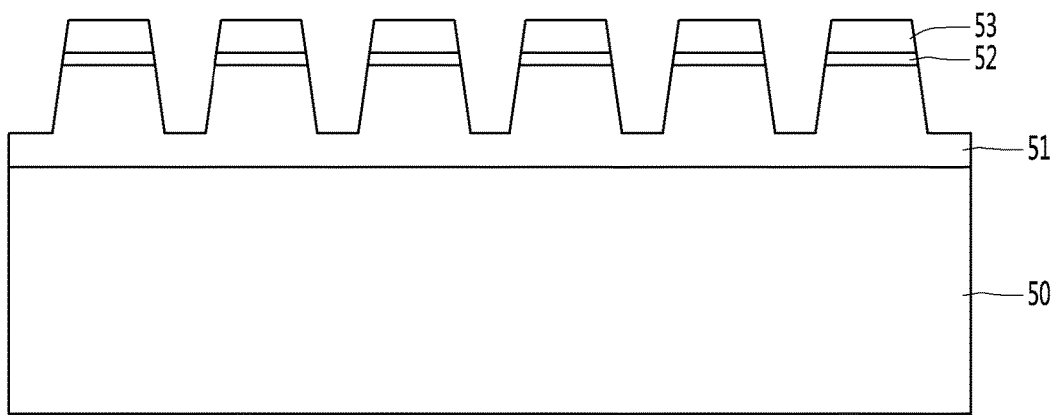

Next, as illustrated in FIG. 6, the isolation process of isolating the semiconductor layer into the plurality of light-emitting structures may be performed, and the n-type semiconductor layer 51 may be exposed between the plurality of light-emitting structures. The p-type semiconductor layer 53 and the active layer 52 may be etched by the isolation process, and a portion of an area of the n-type semiconductor layer 51 may be exposed. Lower areas of the n-type semiconductor layer 51 constituting the plurality of light-emitting structures may be connected to each other. For example, an interval of about 3 micrometers or more may be formed between the plurality of light emitting structures through the isolation process.

As described with reference to FIG. 1, an inclined structure having a width that gradually decreases from the lower surface of the light-emitting structure to the upper surface of the light-emitting structure may be provided through the isolation process. An angle between the lower surface of the light-emitting structure and the side surface of the light-emitting surface may be an acute angle. For example, an angle between the lower surface of the light-emitting structure and the side surface of the light-emitting surface may be about 30 degrees to about 80 degrees. In detail, the angle between the lower surface of the light-emitting structure and the side surface of the light-emitting structure may be about 40 degrees to about 60 degrees.

Figure 7:
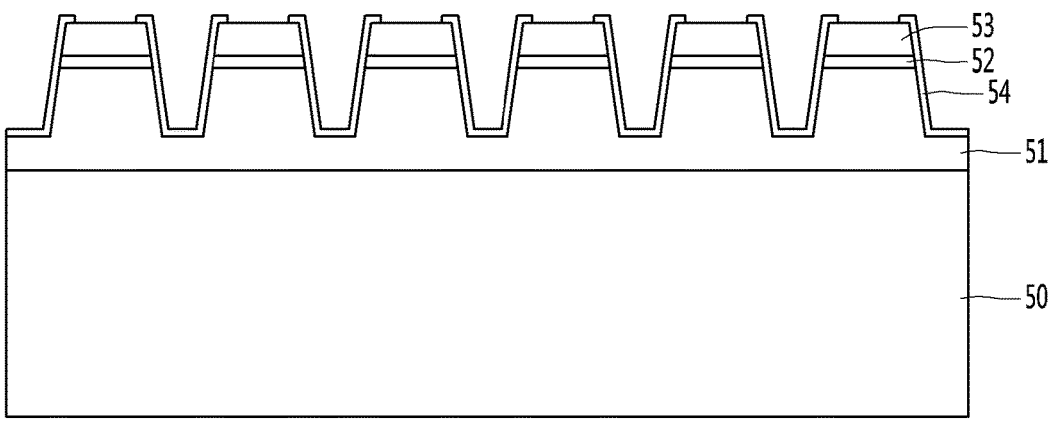

Also, as illustrated in FIG. 7, a protection layer 54 may be formed on the side surface and the upper surface of the plurality of light-emitting structures, which are separated from each other. The upper surface of the p-type semiconductor layer 53 may be exposed by the protection layer 54. The protection layer 15 may be provided to prevent arching from occurring between the adjacent light-emitting structures. The protection layer 54 may include an insulation material. The protection layer 54 may include oxide, nitride, or organic material. The protection layer 54 may be made of, for example, at least one selected from materials such as $SiO_2$, $SiN_x$, $Al_2O_3$, and the like. For example, according to an embodiment, the protection layer 54 may have a thickness of about 1 micrometer or less. In more detail, the protection layer 54 may have a thickness of about 0.1 micrometers to about 1 micrometer.

Figure 8:
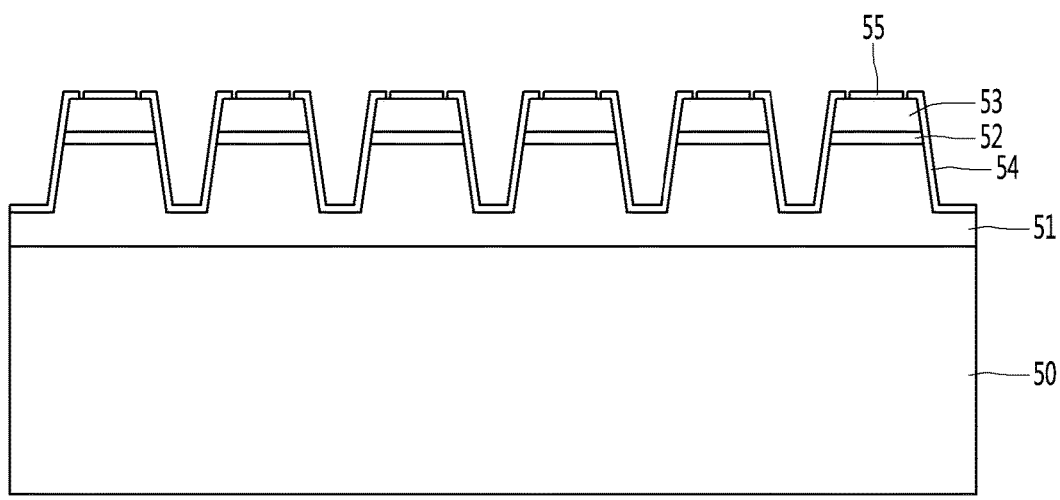

Sequentially, referring to FIG. 8, a p-type contact layer contacting the p-type semiconductor layer 53 of each of the plurality of light-emitting structures may be formed. The p-type contact layer 55 may be disposed on the p-type semiconductor layer 53. The p-type contact layer 55 may be disposed to contact the upper surface of the p-type semiconductor layer 53 exposed through the protection layer 54.

The p-type contact layer 55 may have a width less than that of the upper surface of the p-type semiconductor layer 53. The p-type contact layer 55 may have a width less than that of the active layer 52. For example, according to an embodiment, as described with reference to FIG. 2, the p-type contact layer 55 may have a surface area less than 70% of that of the active layer 52. In case of the general light emitting diode, the light emitting diode may be designed so that the p-type contact layer has a surface area equal to or greater than 80% of that of the active layer. However, in an embodiment, when applied to the display panel, in order to increase in amount of light transmitted in a direction of the p-type contact layer 55, the p-type contact layer 55 may have a relatively small area. For example, the p-type contact layer 55 may have a surface area corresponding to 50% to 70% of that of the active layer 52. The p-type contact layer 55 may have a surface area equal to or greater than 50% of that of the active layer 52 so that power is stably applied to the p-type semiconductor layer 53 through the p-type contact layer 55. Also, the p-type contact layer 55 may have a surface area equal to or less than 70% of that of the active layer 52 to increase in amount of light transmitted in the direction of the p-type contact layer 55.

According to an embodiment, the p-type contact layer 55 may be made of a material that ohmic-contacts the p-type semiconductor layer 53. For example, the p-type contact layer 55 may include transparent conductive oxide. For example, the p-type contact layer 55 may be made of at least one selected from indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, $IrO_x$, $RuO_x$, NiO, Pt, Ag, and Ti. For example, the p-type semiconductor layer 55 may have a thickness of about 0.5 micrometers or less. For example, in more detail, the p-type semiconductor layer 55 may have a thickness of about 0.01 micrometers to about 0.5 micrometers.

Figure 9:
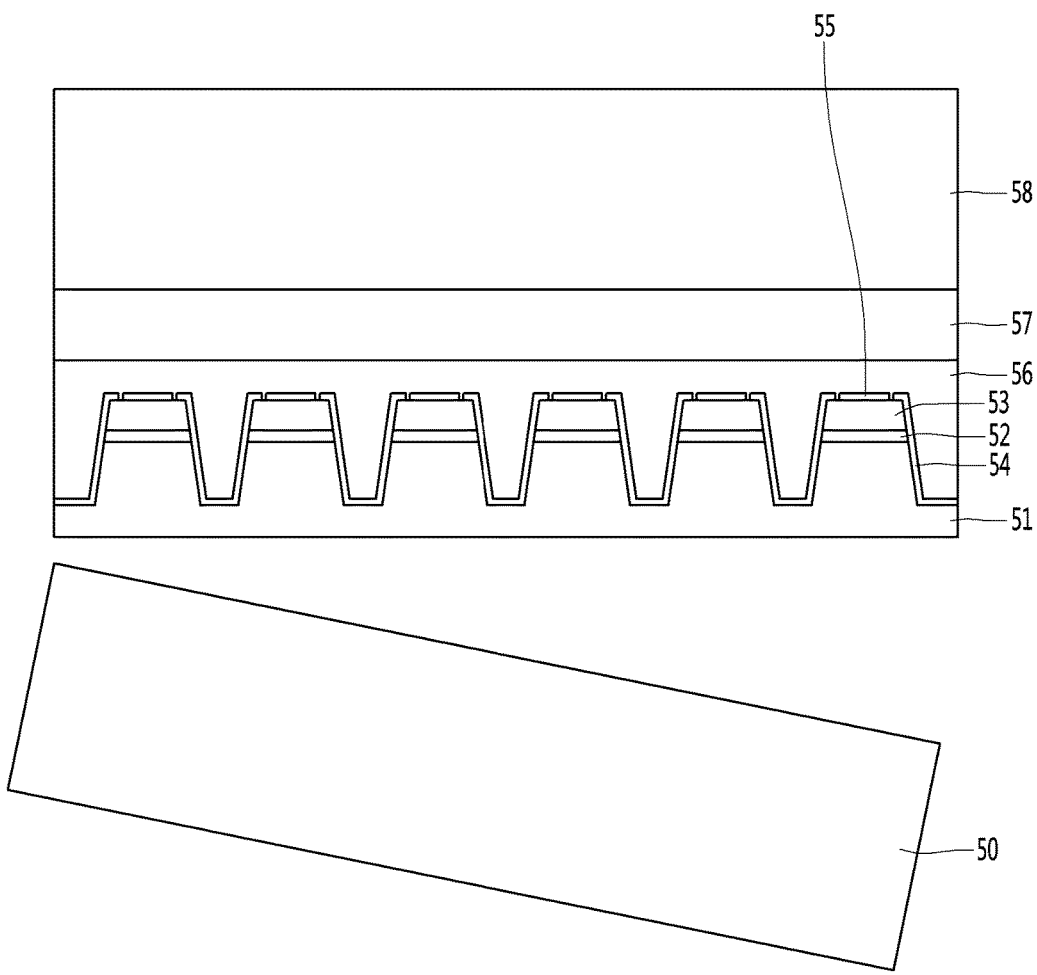

Next, illustrated in FIG. 9, a sacrificial layer 56 may be formed between the side surfaces of the plurality of light-emitting structures and on the p-type contact layer 55. Also, a first temporary substrate 58 may be attached on the sacrificial layer 56 by using an adhesion layer 57, and the growth substrate 50 may be separated.

The sacrificial layer 56 may be provided to remove the first temporary substrate 58 later and include at least one of materials such as GaN, ZnO, ITO, and the like. For example, the sacrificial layer 56 may include a material that is discomposed by laser irradiation. The adhesion layer 57 may include, for example, an organic material. The growth substrate 50 may be separated, for example, through a laser lift-off process. Also, the growth substrate 50 may be separated through a chemical lift-off process, an etching process, or a polishing process.

Figure 10:
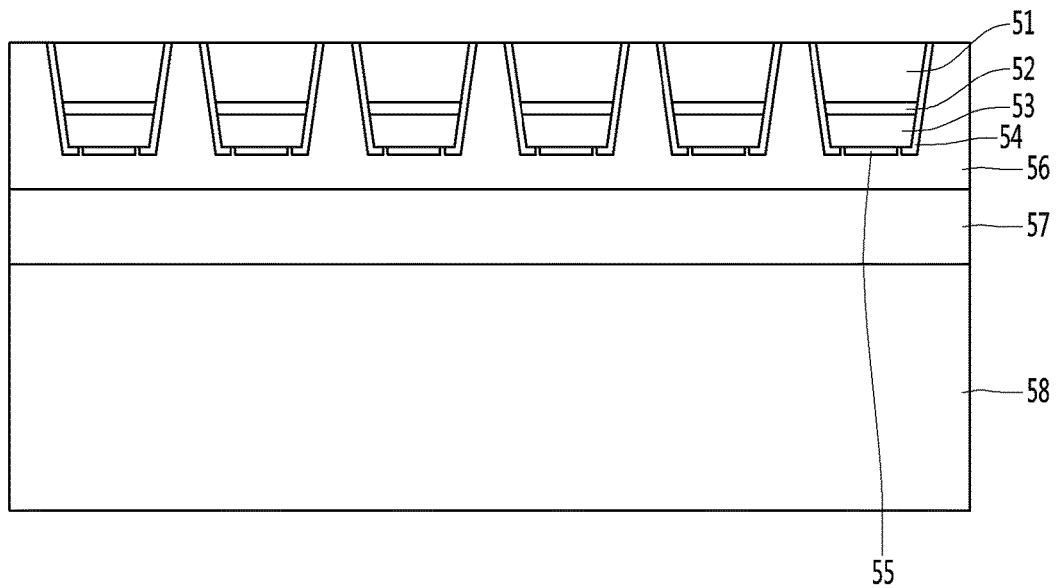

Also, as illustrated in FIG. 10, the n-type semiconductor layer 51 provided between the plurality of light-emitting structures may be etched to expose the sacrificial layer 56 disposed between the plurality of light-emitting structures. That is, the n-type semiconductor layer 51 connected to an upper portion of the semiconductor layer may be etched so that the plurality of light-emitting structures are disposed to be spaced apart from each other. Thus, the upper surface of the sacrificial layer 56 may be exposed between the plurality of light-emitting structures.

Figure 11:
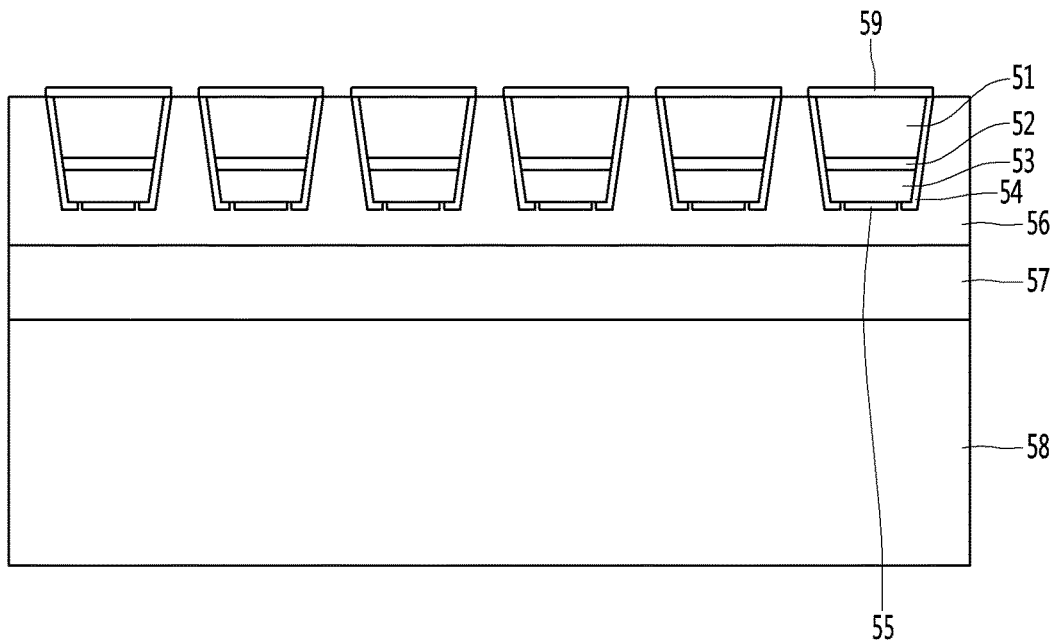

Next, as illustrated in FIG. 11, the n-type contact layer 59 contacting the upper surface of the n-type semiconductor layer 51 may be formed. According to an embodiment, the lower surface of the n-type contact layer 59 may have a width equal to or greater than 70% of that of the lower surface of the n-type semiconductor layer 51. This is done for increasing in amount of light, which is emitted from the active layer 52 and reflected by the n-type contact layer 59 to proceed. For example, the lower surface of the n-type contact layer 59 may have a width greater than that of the lower surface of the n-type semiconductor layer 51. Also, the lower surface of the n-type contact layer 59 may have a width greater than that of the upper surface of the n-type semiconductor layer 51. The lower surface of the n-type contact layer 59 may have the same width as the sum of the widths of the upper surface of the n-type semiconductor layer 51 and the upper surface of the protection layer 54. As described above, since the n-type contact layer 59 has the large width or surface area, light generated from the active layer 52 may be effectively reflected by the n-type contact layer 59.

According to an embodiment, the n-type contact layer 59 may be made of a material that ohmic-contacts the n-type semiconductor layer 51. Also, the n-type contact layer 59 may include a reflective material. For example, the n-type contact layer 59 may have a thickness of about 2 micrometers or less. For example, in more detail, the n-type contact layer 59 may have a thickness of about 0.1 micrometers to about 2 micrometers. The n-type contact layer 59 may include an ohmic contact layer contacting the n-type semiconductor layer 51 and a reflective layer disposed on the ohmic contact layer. The n-type contact layer 59 may include an area that ohmic-contacts the n-type semiconductor layer 51. The n-type contact layer 59 may include a single layer or a multi-layer, which is made of at least one selected from Cr, Ni, Ti, Ge, Zn, Mg, Ca, Al, Ag, Rh, W, Pt, Au, AuGe, AuGe/Ni/Au, and the like.

For reference, the shape and arranged structure of the n-type contact layer 59 illustrated in FIG. 11 may correspond to those of the semiconductor device described with reference to FIG. 3. Thus, the manufacturing process may be applied to be modified corresponding to the semiconductor device described with reference to FIGS. 1 and 4. Also, although bonding layer 21, 121, and 221 described with reference to FIGS. 1, 3, and 4 are not shown in FIG. 11, the bonding layers 21, 121, and 221 may be additionally formed on the n-type contact layer 59.

Figure 12:
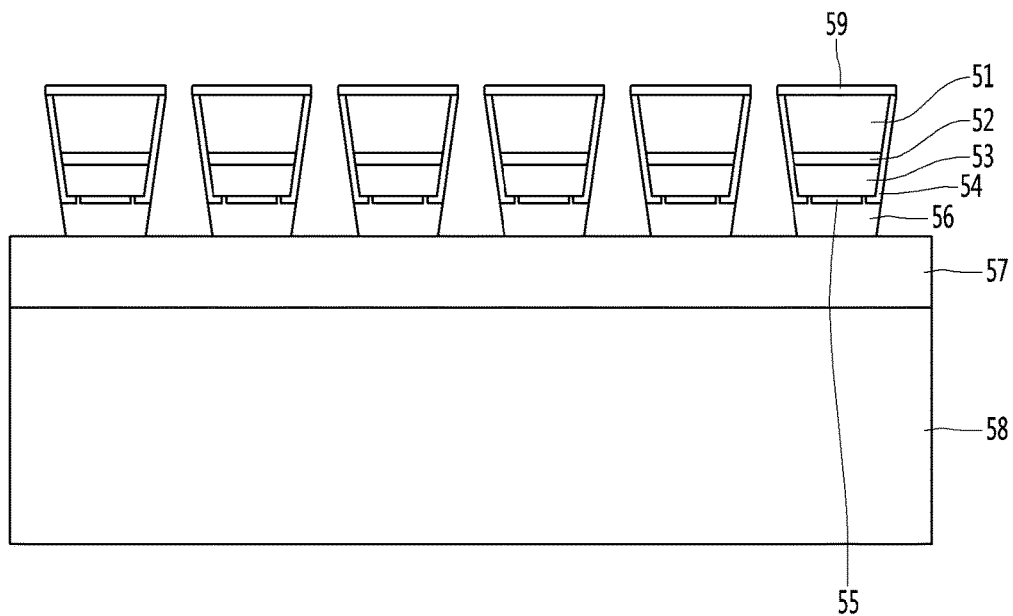

Sequentially, as illustrated in FIG. 12, the sacrificial layer 56 disposed between the plurality of light-emitting structures may be removed, and the adhesion layer 57 may be exposed. According to an embodiment, the n-type semiconductor layer 51, the active layer 52, the p-type semiconductor layer 53, the protection layer 54 disposed on the side surface and the upper surface of the light-emitting structure, the p-type contact layer 55 disposed on the upper surface of the light-emitting structure, and the n-type contact layer 59 disposed under the light-emitting structure, which constitute the light emitting-structure, may be called a semiconductor device as the whole. The plurality of semiconductor devices may be disposed at a predetermined interval on the adhesion layer 57. According to an embodiment, a semiconductor device having the form of a chip scale package may be manufactured through the above-described manufacturing process.

Figure 13:
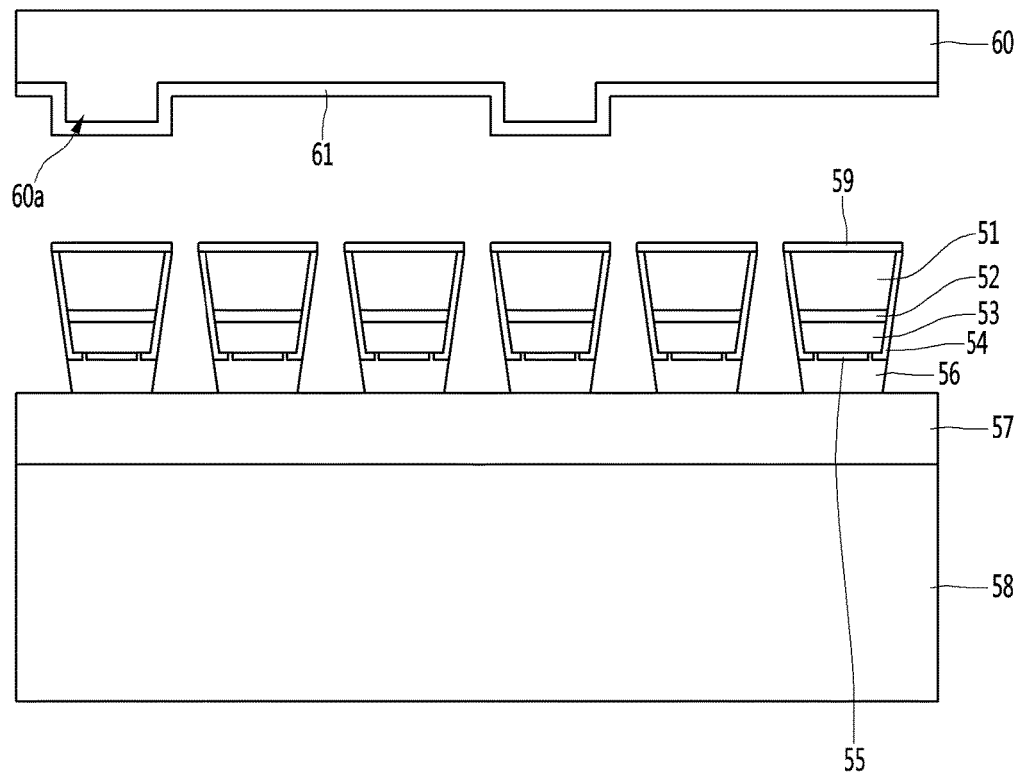
Figure 14:
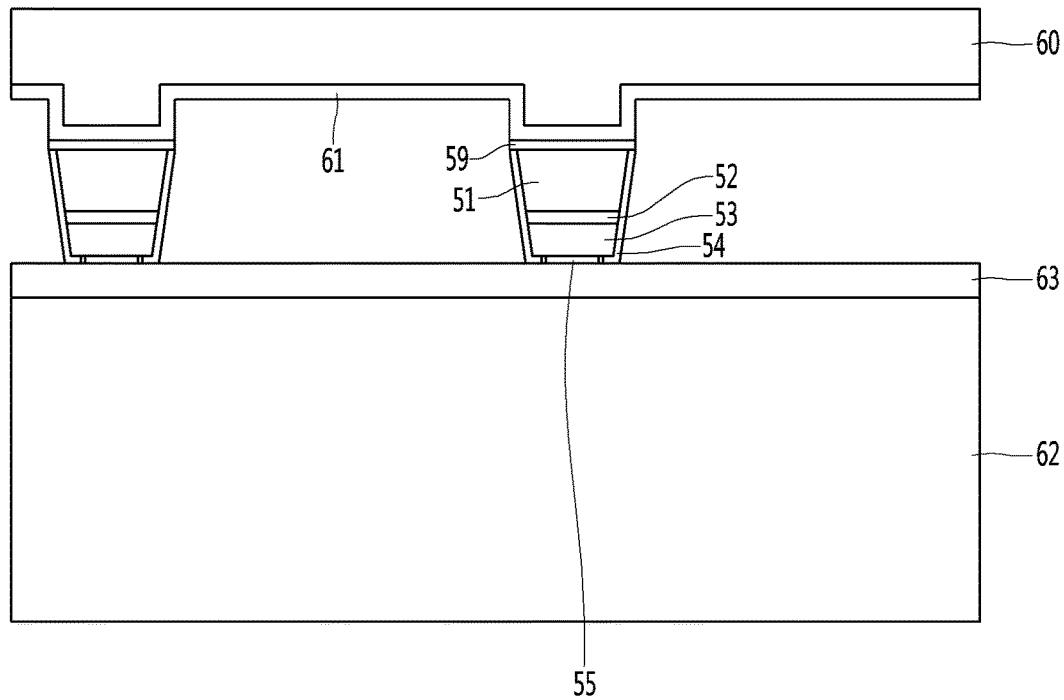
Figure 15:
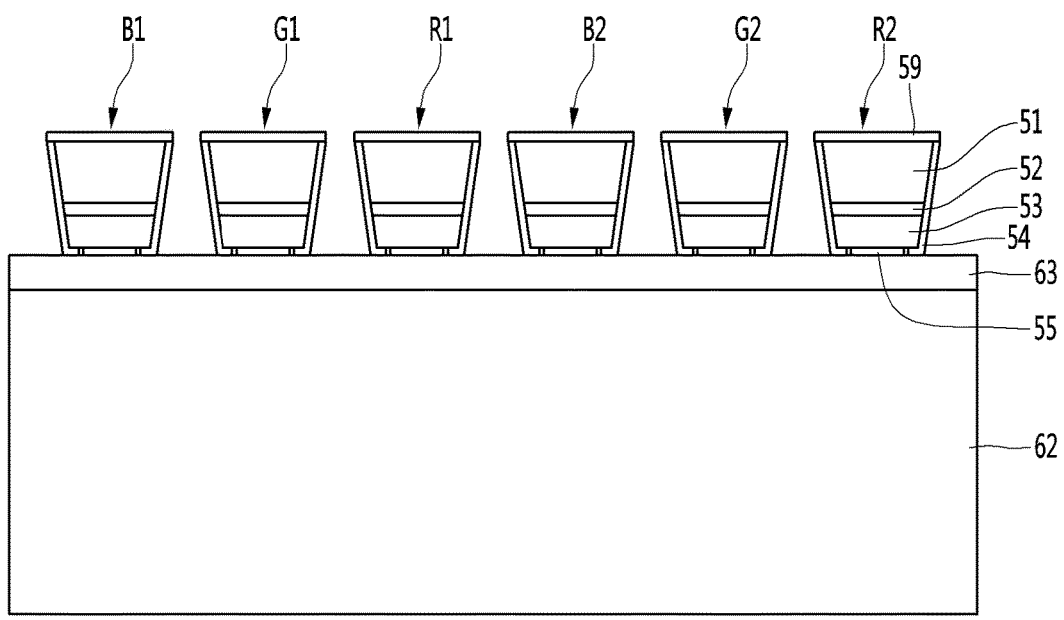

Also, as illustrated in FIGS. 13 to 15, a portion of the plurality of light-emitting structure may be separated from the first temporary substrate 58 and then arranged at a predetermined interval on a second temporary substrate 62. That is, the semiconductor devices including the light-emitting structure may be separated from the first temporary substrate 58 and arranged at a predetermined interval on the second temporary substrate 62.

According to an embodiment, as illustrated in FIG. 13, a pick-up substrate 60 may be disposed on the first temporary substrate 58 on which the plurality of semiconductor devices having the form of the chip scale package are aligned. A pick-up protrusion 60a may be provided on the pick-up substrate 60. The pick-up substrate 60 may include a plurality of pick-up protrusions 60a. The pick-up protrusions 60a may be arranged at a predetermined interval on the pick-up substrate 60 and be provided to be disposed on the semiconductor device, which intends to be picked up, of the plurality of semiconductor devices arranged on the first temporary substrate 58. A first resin layer 61 may be provided on the pick-up substrate 60 and the pick-up protrusion 60a. The first resin layer 61 may provide adhesion force between the pick-up protrusion 60a and the semiconductor device, which intends to be picked up. Due to the adhesion and separation between the pick-up substrate 60 and the first temporary substrate 58, the semiconductor devices arranged on the first temporary substrate 58 to correspond to each other may be attached to the first resin layer 61 provided on the plurality of pick-up protrusions 50a and then be separated from the first temporary substrate 58. According to an embodiment, the first resin layer 61 may include an adhesive material that is changed in adhesion force by applying heat or irradiating light having a specific wavelength band.

For example, the first resin layer 61 may be changed in adhesion force by a change of a temperature. The first resin layer 61 may be reduced in adhesion force under an environment of a specific temperature or more. In this case, in the pick-up process described with reference to FIG. 13, the first resin layer may be set to have a specific temperature or less, thereby improving the adhesion force so that the desired semiconductor device is picked up. Also, in the arranging process described with reference to FIG. 14, the first resin layer 61 may have a specific temperature or more to weaken the adhesion force so that the corresponding semiconductor device is disposed to easily move from the pick-up substrate 60 to the second temporary substrate 62.

For example, the first resin layer 61 may be changed in adhesion force by irradiating light having a specific wavelength band. Thus, the light having the specific wavelength band may be irradiated on to the first resin layer 61 to reduce the adhesion force. In this case, in the pick-up process described with reference to FIG. 13, the light having the specific wavelength band may be prevented from being irradiated onto the first resin layer 61 to improve the adhesion force so that the desired semiconductor device is picked up. Also, in the arranging process described with reference to FIG. 14, the light having the specific wavelength band may be irradiated onto the first resin layer 61 to weaken the adhesion force so that the corresponding semiconductor device is disposed to easily move from the pick-up substrate 60 to the second temporary substrate 62. For example, the first resin layer 61 may include an adhesive material that is changed in adhesion force by irradiating light having a ultraviolet wavelength region.

When a transfer process is performed by using a vacuum chuck or an electrostatic chuck to pick up and arrange the semiconductor device, the pick-up and the arrangement may be affected by a surface state of the pick-up semiconductor device. Thus, a phenomenon in which a portion of the semiconductor devices is separated from the vacuum chuck or the electrostatic chuck while the semiconductor devices are collectively picked up and arranged. When a portion of the semiconductor devices is separated from the vacuum chuck or the electrostatic chuck during the transfer process, since the semiconductor devices have to be picked up and arranged through a separate process with respect to an area on which the separated semiconductor devices have to be arranged, a manufacturing time may increase. Also, as the manufacturing process is performed, a head of the vacuum chuck or the electrostatic chuck may be worn out. Thus, a problem may arise in picking up the semiconductor device normally.

On the other hand, according to the above-described embodiment, since the predetermined semiconductor device is picked up by using the resin layer having the elasticity and adhesion, the corresponding semiconductor device may be accurately picked up regardless of the surface state of the semiconductor device. Also, the adhesion force of the resin layer may be adjusted to accurately locate the semiconductor device at a desired place.

According to an embodiment, as illustrated in FIG. 14, the plurality of semiconductor devices separated from the first temporary substrate 58 may be disposed to be aligned on the second temporary substrate 62. The second resin layer 63 may be provided on the second temporary substrate 62, and the plurality of semiconductor devices may be disposed to be aligned on the second resin layer 63.

As illustrated in FIG. 15, the semiconductor devices, which are picked up and manufactured through a process similar to the above-described process, may be additionally disposed to be aligned on the second temporary substrate 62. The plurality of semiconductor devices having different characteristics may be disposed to be aligned on the second temporary substrate 62. For example, the plurality of semiconductor devices may have different emission wavelength bands, different orientation angles, different brightness characteristics, or the like.

According to an embodiment, FIG. 15 illustrates a case in which blue semiconductor devices B1 and B2, green semiconductor devices G1 and G2, and red semiconductor devices R1 and R2 are disposed to be aligned. For example, the blue semiconductor devices B1 and B2 may be manufactured through a process similar to the process described with reference to FIGS. 5 to 13 and picked up and then disposed to be aligned on the second temporary substrate 62. Also, the green semiconductor devices G1 and G2 may be manufactured through a process similar to the process described with reference to FIGS. 5 to 13 and picked up and then disposed to be aligned on the second temporary substrate 62. Also, the red semiconductor devices R1 and R2 may be manufactured through a process similar to the process described with reference to FIGS. 5 to 13 and picked up and then disposed to be aligned on the second temporary substrate 62.

Figure 16:
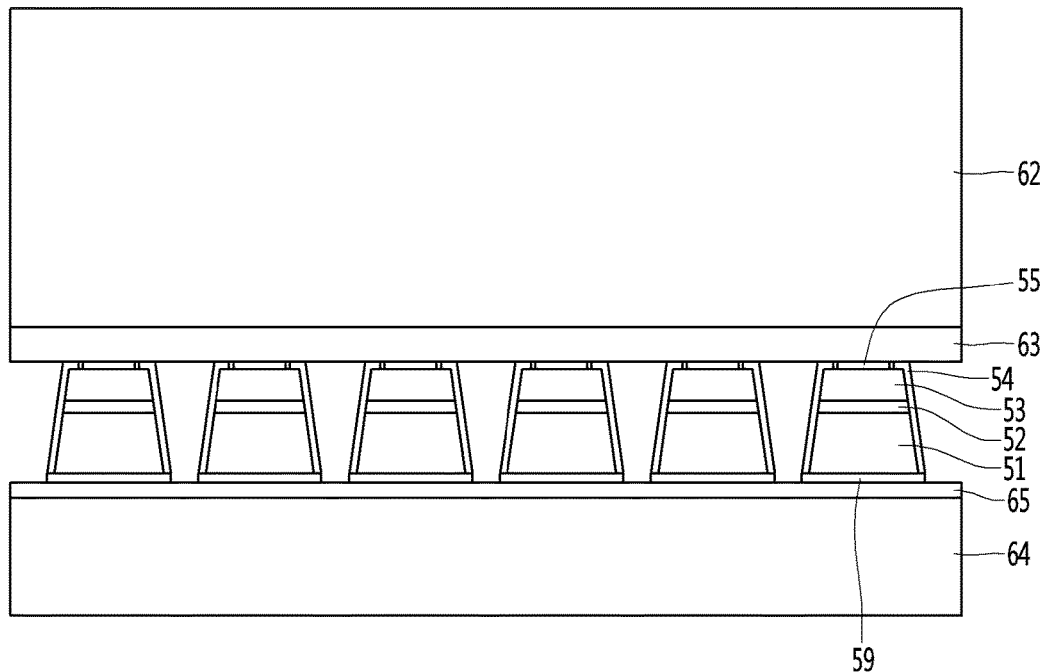
Figure 17:
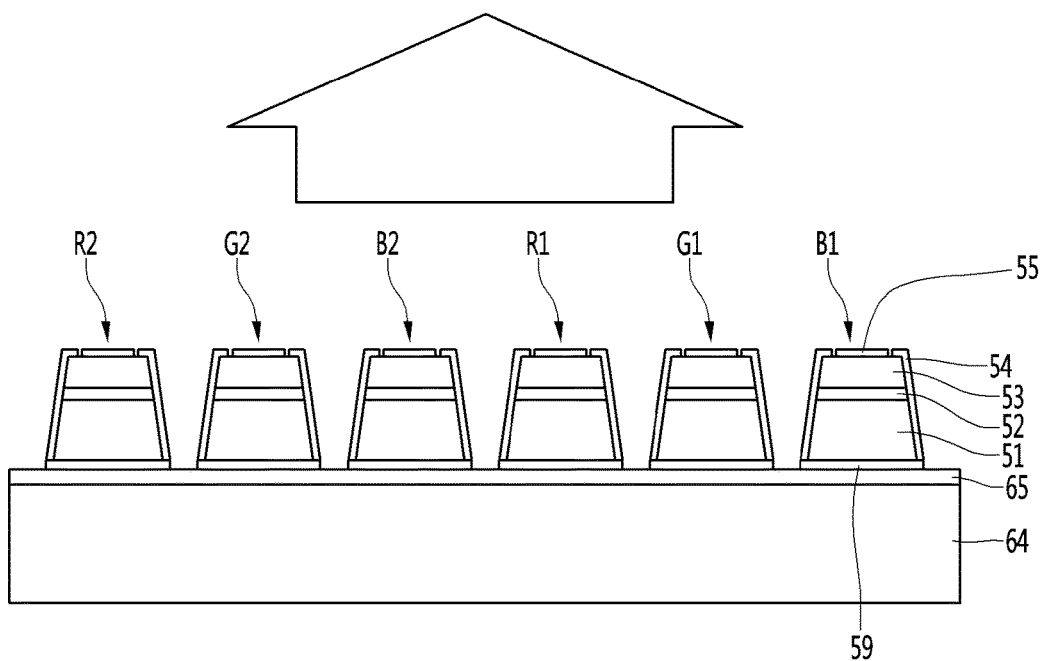

Next, as illustrated in FIGS. 16 and 17, the semiconductor devices B1, B2, G1, G2, R1, and R2 arranged on the second temporary substrate 62 may be collectively attached to a panel 64, and then, the second temporary substrate 62 may be removed. Thus, the plurality of semiconductor devices B1, B2, G1, G2, R1, and R2 may be disposed to be aligned on the panel 64. The plurality of semiconductor devices B1, B2, G1, G2, R1, and R2 may be electrically connected to a terminal disposed on the panel 64. Also, the plurality of semiconductor devices B1, B2, G1, G2, R1, and R2 may be provided with an anisotropic conductive film (ACF) 65 between the panels 64.

The anisotropic conductive film 65 may provide an electrically connected conductive property in one direction and an insulating property in another direction. For example, the anisotropic conductive film 65 may provide an electrically connected conductive property in a thickness direction. Thus, the plurality of semiconductor devices B1, B2, G1, G2, R1, and R2 may be electrically connected to the terminal provided on the panel 64 and thus be driven. Also, the anisotropic conductive film 65 may provide an insulating property in a direction perpendicular to the thickness direction to prevent the plurality of semiconductor devices B1, B2, G1, G2, R1, and R2 from being electrically conducted to each other.

The display panel according to an embodiment may be realized through the above-described manufacturing process. Power may be applied to the n-type contact layer 59 of each of the semiconductor devices through the panel 64 of the display panel. Also, power may be applied to the p-type contact layer 55 through a separate circuit. As described above, since the power may be applied to the n-type contact layer 59 and the p-type contact layer 55, degrees of emission of the semiconductor devices disposed on the display panel may be controlled.

Although only the plurality of semiconductor devices B1, B2, G1, G2, R1, and R2 are illustrated in FIG. 17, the semiconductor devices may be aligned to match resolution to be realized on the display panel. For example, the semiconductor devices B1, G1, and R1 may constitute one pixel, and the semiconductor devices B2, G2, and R2 may constitute different one pixel. FIG. 17 illustrates a portion of a cross-section of the display panel. When viewed in the plane of the display panel, the display panel may have predetermined horizontal and vertical lengths, and also, the pixels may be arranged in horizontal/vertical directions to match the resolution on the plane.

The above-described display panel manufacturing process may be variously modified according to the design within the range known in the art to which the present invention belongs. For example, as described with reference to FIGS. 7 and 8, the isolation process may be performed on the semiconductor layer, and then, the protection layer may be formed to form the p-type contact layer. Alternatively, the manufacturing process may be changed so that the p-type contact layer is formed, and then, the protection layer is formed.

The semiconductor device according to an embodiment may have an inclined structure having a width that gradually decreases upward from a lower side of the light-emitting structure. Also, the n-type contact layer disposed under the light-emitting structure may have a large width or surface area to increase in reflectivity, and the p-type contact layer disposed on the light-emitting structure may have a small width or surface area to increase in transmittance. Therefore, light generated from the active layer may be effectively extracted toward the upper side of the light-emitting structure.

The above-described semiconductor device may be configured to emit light having various wavelength bands according to the selection of the active layer. For example, the semiconductor device may be realized as a micro semiconductor device having a width and length of about 200 micrometers or less. For example, the display panel or the display device constituting one color pixel may be realized by using the above-described blue, green, and red semiconductor devices, each of which has the micrometer size. The semiconductor device according to an embodiment may be applied to various fields that require a light source. The semiconductor device according to the embodiment may be applied as a light source that realizes high resolution by being applied to an electric signboard, a large display device, a signage, and the like.

In the method for manufacturing the display panel according to the embodiment, the semiconductor device may be manufactured in the form of the chip scale package. Thus, since the display panel is formed by performing the transfer process on the semiconductor device having the form of the chip scale package, the manufacturing yield may increase, and the manufacturing cost may be reduced.

Figure 18:
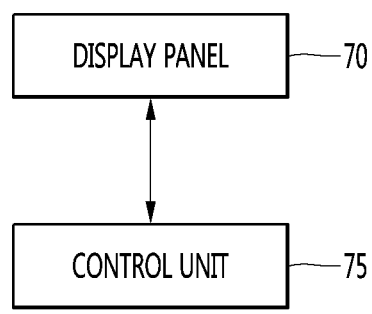
FIG. 18 is a view of a display device according to an embodiment.

FIG. 18 is a view of a display device according to an embodiment.

As illustrated in FIG. 18, the display device according to an embodiment may include a display panel 70 including the above-described semiconductor device and a control unit 75. The control unit 75 may control emission of the semiconductor device provided on the display panel 70. The control unit may control power applied to a n-type contact layer and a p-type contact layer of the semiconductor device provided on the display panel 70 to provide a desired image on the display panel 70.

Features, structures, and effects described in the above embodiments are incorporated into at least one embodiment, but are not limited to only one embodiment. Furthermore, features, structures, and effects exemplified in one embodiment can easily be combined and modified for another embodiment by those skilled in the art. Therefore, these combinations and modifications should be construed as falling within the scope of the present invention.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

In the semiconductor device, the display panel including the semiconductor device, and the display device according to the embodiment, the light extraction efficiency can be improved, the high resolution can be realized, the manufacturing yield can be increased, and the manufacturing cost can be reduced.

In the method for manufacturing the display panel according to the embodiment, the light extraction efficiency can be improved, the high resolution can be realized, the manufacturing yield can be increased, and the manufacturing cost can be reduced.

In the method for manufacturing the display panel according to the embodiment, the semiconductor device may be manufactured in the form of the chip scale package. Thus, since the display panel is formed by performing the transfer process on the semiconductor device having the form of the chip scale package, the manufacturing yield can be increased, and the manufacturing cost can be reduced.

The invention claimed is:

1. A method for manufacturing a display panel, the method comprising:

forming a semiconductor layer on a growth substrate, the semiconductor layer comprising an n-type semiconductor layer, an active layer formed on the n-type semiconductor layer, and a p-type semiconductor layer formed on the active layer;

performing an isolation process of isolating the semiconductor layer into a plurality of light-emitting structures to expose the n-type semiconductor layer between the plurality of light-emitting structures;

forming a protection layer on side and upper surfaces of each of the plurality of light emitting structures;

forming a p-type contact layer contacting the p-type semiconductor layer of each of the plurality of light-emitting structures;

forming a sacrificial layer between the side surfaces of the plurality of light-emitting structures and on the p-type contact layer;

attaching a first temporary substrate on the sacrificial layer by using an adhesion layer and separating the growth substrate;

etching the n-type semiconductor layer provided between the plurality of light-emitting structures to expose the sacrificial layer disposed between the plurality of light-emitting structures;

forming an n-type contact layer contacting an upper surface of the n-type semiconductor layer;

removing the sacrificial layer disposed between the plurality of light-emitting structures to expose the adhesion layer;

separating a portion of the plurality of light-emitting structures from the first temporary substrate so as to be arranged a predetermined interval on a second temporary substrate; and collectively attaching the light-emitting structures, which are arranged on the second temporary substrate, on a panel and removing the second temporary substrate.

2. The method according to claim 1, wherein the n-type contact layer has a first area contacting the lower surface of the n-type semiconductor layer and a second area contacting a side surface of the n-type semiconductor layer.

3. The method according to claim 1, wherein a lower surface of the protection layer is disposed to contact the upper surface of the n-type contact layer.

4. The method according to claim 1 wherein the upper surface of the n-type contact layer has a width equal to or greater than 70% of a width of the lower surface of the n-type semiconductor layer.

* * * * *